(12) United States Patent
Lee (10) Patent No.: US 10,176,872 B2
(45) Date of Patent: Jan. 8, 2019

(54) SEMICONDUCTOR DEVICE HAVING EQUALIZING PERIOD, MEMORY SYSTEM HAVING THE SAME, AND READ METHOD THEREOF

(71) Applicant: SK hynix Inc., Gyeonggi-do (KR)

(72) Inventor: Jong Won Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/671,634

(22) Filed: Aug. 8, 2017

(65) Prior Publication Data

US 2018/0190354 A1 Jul. 5, 2018

(30) Foreign Application Priority Data

Jan. 3, 2017 (KR) .................. 10-2017-0000844

(51) Int. Cl.
| | |
|---|---|
| *G11C 16/06* | (2006.01) |
| *G11C 16/04* | (2006.01) |
| *G11C 16/34* | (2006.01) |
| *G11C 11/56* | (2006.01) |
| *G11C 16/10* | (2006.01) |
| *G11C 16/08* | (2006.01) |
| *G11C 16/26* | (2006.01) |
| *G11C 8/08* | (2006.01) |
| *G11C 29/12* | (2006.01) |

(52) U.S. Cl.
CPC ............ *G11C 16/0483* (2013.01); *G11C 8/08* (2013.01); *G11C 11/5642* (2013.01); *G11C 16/08* (2013.01); *G11C 16/10* (2013.01); *G11C 16/26* (2013.01); *G11C 16/3445* (2013.01); *G11C 2029/1202* (2013.01)

(58) Field of Classification Search
CPC .................................................. G11C 16/0483
USPC ..................................................... 365/185.25
See application file for complete search history.

(56) References Cited

U.S. PATENT DOCUMENTS

| | | | |
|---|---|---|---|
| 2016/0163394 A1* | 6/2016 | Yoo ........................ | G11C 16/24 365/185.11 |
| 2016/0240264 A1* | 8/2016 | Hosono .............. | G11C 16/3459 |

FOREIGN PATENT DOCUMENTS

KR 1020130095499 8/2013

* cited by examiner

*Primary Examiner* — Hoai V Ho
(74) *Attorney, Agent, or Firm* — IP & T Group LLP (57) ABSTRACT

A method for operating a semiconductor device includes activating a first selection line coupled to a selected first memory string and deactivating a second selection line coupled to an unselected second memory string, applying a read voltage to a selected word line and a pass voltage to an unselected word line, and equalizing the selected word line and the unselected word line, wherein the second selection line is turned on during the equalizing of the selected and unselected word lines.

17 Claims, 8 Drawing Sheets

SEMICONDUCTOR DEVICE HAVING EQUALIZING PERIOD, MEMORY SYSTEM HAVING THE SAME, AND READ METHOD THEREOF

CROSS-REFERENCE TO RELATED APPLICATION

The present application claims priority under 35 U.S.C. § 119(a) to Korean patent application number 10-2017-0000844, filed on Jan. 3, 2017, the entire disclosure of which is herein incorporated by reference in its entirety.

BACKGROUND

Field of Invention

Various embodiments of the invention relate generally to an electronic device, and more particularly, to a semiconductor device, an operating method thereof, and a memory system.

Description of Related Art

A semiconductor memory device is a memory device embodied by using semiconductors such as silicon (Si), germanium (Ge), gallium arsenide (GaAs), and indium phosphide (InP). Semiconductor memory devices are classified into volatile memory devices and non-volatile memory devices.

Volatile memory devices lose stored data when powered off. Examples of volatile memory devices include Static RAM (SRAM), Dynamic RAM (DRAM) and Synchronous DRAM (SDRAM). Non-volatile memory devices retain stored data regardless of power on/off conditions. Examples of non-volatile memory include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM) and Ferroelectric RAM (FRAM). Flash memories are classified into NOR-type memories and NAND-type memories.

SUMMARY

Various embodiments are directed to a semiconductor device capable of improving data reliability and operating speed, a method for operating the semiconductor device, and a memory system.

According to an embodiment, a method for operating a semiconductor device may include activating a first selection line coupled to a selected first memory string and deactivating a second selection line coupled to an unselected second memory string, applying a read voltage to a selected word line and a pass voltage to an unselected word line, and equalizing the selected word line and the unselected word line, wherein the second selection line is turned on during the equalizing of the selected and unselected word lines.

According to an embodiment, a method for operating a semiconductor device may include turning on a first drain selection line and a first source selection line corresponding to a selected first memory string and turning off a second drain selection line and a second source selection line corresponding to an unselected second memory string, applying a read voltage to a selected word line and a pass voltage to an unselected word line, and equalizing the selected word line and the unselected word line, wherein the second source selection line is turned on during the equalizing of the selected and unselected word lines.

According to an embodiment, a semiconductor device may include a bit line, a plurality of memory strings connected in common to the bit line, a plurality of first selection lines controlling connections between the plurality of memory strings and the bit line, respectively, a source line commonly coupled to the plurality of memory strings, a plurality of second selection lines controlling connections between the plurality of memory strings and the source line, respectively, and a control logic temporarily activating at least one selection line coupled to unselected memory strings, among the first and second selection lines, during a read operation.

According to an embodiment, a memory system may include a controller, and a memory device including memory strings, word lines coupled to the memory strings, and selection lines coupled to the memory strings, wherein the controller controls the memory device to perform a read operation, wherein the read operation includes a period during which a selected word line and unselected word lines are equalized and at least one of the selection lines coupled to the unselected memory strings is temporarily activated.

DETAILED DESCRIPTION

Hereinafter, various exemplary embodiments will be described in detail with reference to the accompanying drawings. In the drawings, thicknesses and lengths of components may be exaggerated for convenience of illustration. In the following description, a detailed description of related functions and constitutions may be omitted for simplicity and conciseness. Like reference numerals refer to like elements throughout the specification and drawings.

It is also noted that in this specification, "connected/coupled" refers to one component not only directly coupling another component but also indirectly coupling another component through an intermediate component. In addition, throughout the specification, when it is said that a certain part "includes" a certain element, this does not exclude other elements from being included but the certain part may further include another element unless particularly described otherwise.

Figure 1:
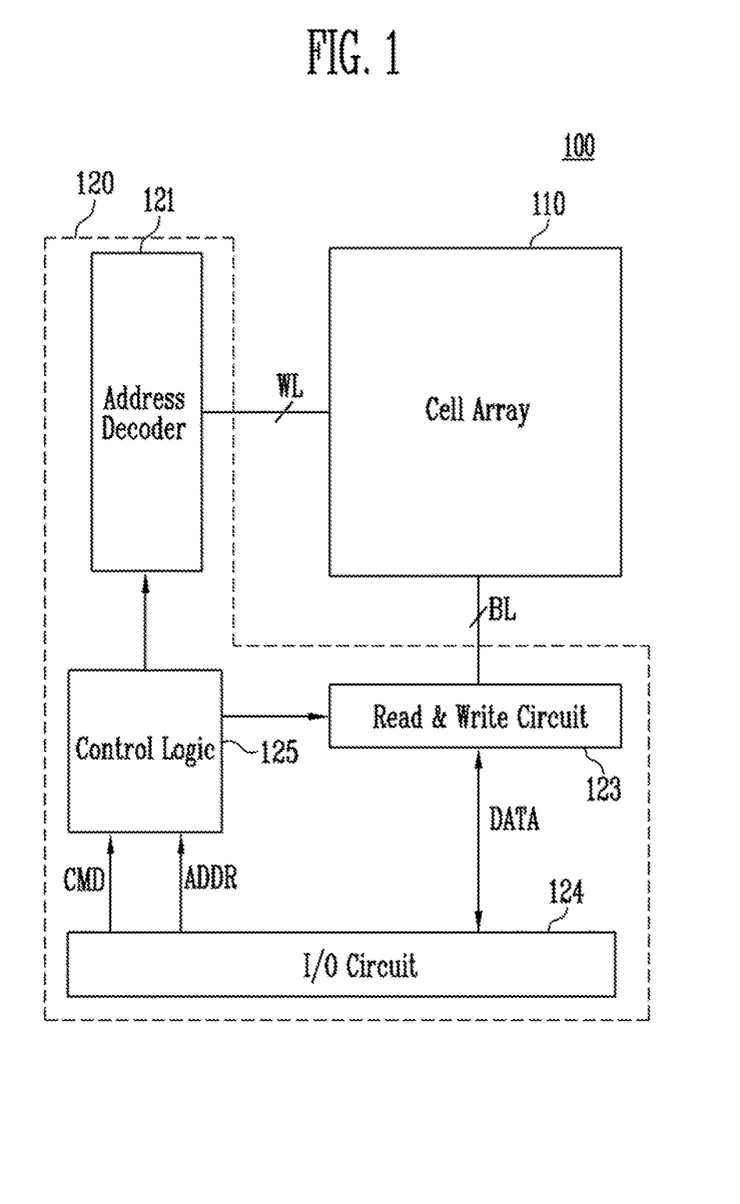
FIG. 1 is a block diagram illustrating a semiconductor device according to an embodiment of the present invention.

FIG. 1 is a block diagram illustrating a semiconductor device 100 according to an embodiment of the present invention.

Referring to FIG. 1, the semiconductor device 100 may include a cell array 110 and a peripheral circuit 120. The peripheral circuit 120 may include an address decoder 121, a read and write circuit 123, an input/output circuit 124 and a control logic 125.

The cell array 110 may be coupled to the address decoder 121 through word lines WL and to the read and write circuit 123 through bit lines BL. The cell array 110 may include a plurality of memory strings (not shown). The plurality of memory strings may be arranged in a horizontal direction or a vertical direction to a substrate. The detailed structure of the cell array 110 is described below with reference to FIGS. 2, 4 and 5.

In addition, the cell array 110 may include a plurality of memory blocks (not shown), and each of the plurality of memory blocks may include a plurality of pages. For example, the semiconductor device 100 may perform an erase operation in units of memory blocks and a program operation or a read operation in units of pages.

The control logic 125 may be coupled to the address decoder 121, the read and write circuit 123 and the input/output circuit 124. The control logic 125 may receive a command CMD and an address ADDR from the input/output circuit 124 and control the address decoder 121 and the read and write circuit 123 to perform an internal operation in response to the received command CMD.

The control logic 125 may control the semiconductor device 100 to temporarily activate at least one selection line coupled to unselected memory strings during a read operation. For example, the control logic 125 may equalize a selected word line and unselected word lines, and activate at least one selection line during an equalizing period. That is, a read operation may include the equalizing period during which the selected word line and the unselected word lines are equalized, and at least one selection line may be activated during the equalizing period.

According to the above control method, the period during which at least one of the selection lines coupled to the unselected memory strings is temporarily activated may be included in the read operation, so that a channel of the unselected memory strings may be initialized. Therefore, reliability of the semiconductor device 100 may be improved.

The control logic 125 may control the semiconductor device 100 to apply a reference voltage having a voltage level lower than a pass voltage to the unselected word lines before applying the pass voltage. In addition, the control logic 125 may control the semiconductor device 100 to apply the pass voltage to the selected word line before applying a read voltage, and apply the reference voltage to the selected word line before applying the pass voltage.

According to this control method, since the reference voltage may be applied to the unselected word line before the pass voltage is applied, floating levels of the unselected memory strings may be reduced and cell distribution deterioration may be avoided.

The address decoder 121 may be coupled to the cell array 110 through the word lines WL and control the word lines WL in response to control of the control logic 125. Therefore, the address decoder 121 may receive the address ADDR from the control logic 125 and select one of the memory blocks of the cell array 110 in response to the received address ADDR.

For example, a program operation and a read operation of the semiconductor device 100 may be performed in units of pages. Therefore, during the program operation and the read operation, the address ADDR may include a block address and a row address. The address decoder 121 may decode the block address included in the address ADDR and select one of the memory blocks according to the decoded block address. The address decoder 121 may decode the row address included in the received address ADDR and select one of the word lines WL, that is, the pages of the selected memory block, according to the decoded row address.

In another example, an erase operation of the semiconductor device 100 may be performed in units of memory blocks. Therefore, during the erase operation, the address ADDR may include a block address. The address decoder 121 may decode the block address and select one of the memory blocks according to the decoded block address.

The read and write circuit 123 may be coupled to the cell array 110 through the bit lines BL. During a program operation, the read and write circuit 123 may transfer data DATA received from the input/output circuit 124 to the bit lines BL, and memory cells of the selected page may be programmed with the transferred data DATA. During a read operation, the read and write circuit 123 may read the data DATA from the memory cells of the selected page through the bit lines BL and output the read data DATA to the input/output circuit 124. During an erase operation, the read and write circuit 123 may float the bit lines BL.

Figure 2:
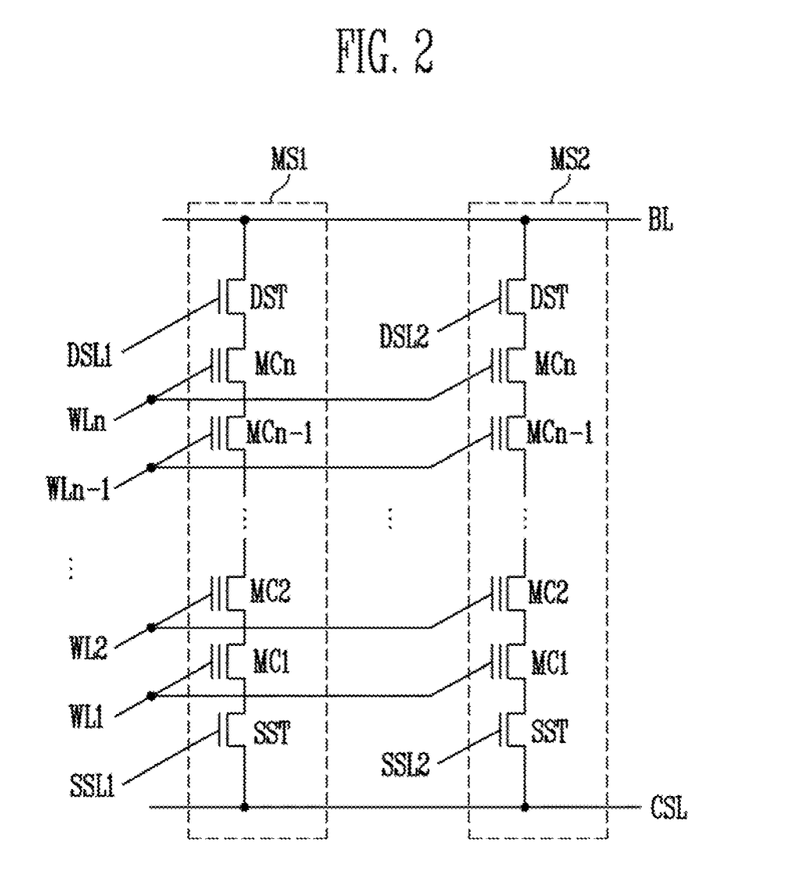
FIG. 2 is a circuit diagram illustrating a cell array structure of a semiconductor device according to an embodiment of the present invention.

FIG. 2 is a circuit diagram illustrating a cell array structure of a semiconductor device according to an embodiment of the present invention.

Referring to FIG. 2, first and second memory strings MS1 and MS2 may be coupled between the bit line BL and a common source line CSL. In addition, each of the first and second memory strings MS1 and MS2 may include at least one drain selection transistor DST, a plurality of memory cells MC1 to MCn and at least one source selection transistor SST coupled in series between the bit line BL and the common source line CSL. Though not shown in FIG. 2, each of the first and second memory strings MS1 and MS2 may further include a pipe transistor disposed between the plurality of memory cells MC1 to MCn.

The first and second memory strings MS1 and MS2 may be coupled in common to the bit line BL. In addition, a first drain selection line DSL1 may control the connection between the first memory string MS1 and the bit line BL, and a second drain selection line DSL2 may control the connection between the second memory string MS2 and the bit line BL. For reference, the drain selection transistor DST of each of the first and second memory strings MS1 and MS2 may be coupled to the bit line BL, and have a gate electrode controlled by a corresponding one of the first drain selection line DSL1 and the second drain selection line DSL2.

The first and second memory strings MS1 and MS2 may be commonly coupled to the common source line CSL. In addition, a first source selection line SSL1 may control the connection between the first memory string MS1 and the common source line CSL, and a second source selection line SSL2 may control the connection between the second memory string MS2 and the common source line CSL. For reference, the source selection transistor SST of each of the first and second memory strings MS1 and MS2 may be coupled to the common source line CSL, and have a gate electrode controlled by a corresponding one of the first source selection line SSL1 and the second source selection line SSL2.

First to nth word lines WL1 to WLn may be coupled to gate electrodes of the first to nth memory cells MC1 to MCn, respectively. The first to nth memory cells MC1 to MCn of each of the first and second memory strings MS1 and MS2 may be coupled between the drain selection transistor DST and the source selection transistor SST. In addition, the first memory string MS1 and the second memory string MS2 may share the first to nth word lines WL1 to WLn.

Figure 3:
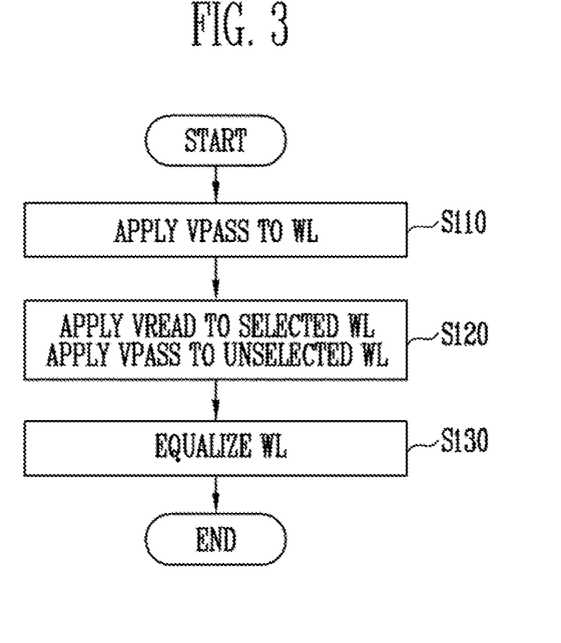
FIG. 3 is a flowchart illustrating a method of operating a semiconductor device according to an embodiment of the present invention.

FIG. 3 is a flowchart illustrating a method for operating a semiconductor device according to an embodiment of the present invention. Hereinafter, a description will be made to an example in which the first memory string MS1 and a second word line WL2 are selected when the semiconductor device having the cell array structure shown in FIG. 2 performs a read operation.

First, a pass voltage $V_{PASS}$ may be applied to the word lines WL1 to WLn, at step S110. The pass voltage $V_{PASS}$ may have a voltage level to turn on a memory cell regardless of data stored in the memory cell. For example, the pass voltage $V_{PASS}$ may be an operating voltage $V_{CC}$. In addition, before the pass voltage $V_{PASS}$ is applied to the word lines WL1 to WLn, a reference voltage $V_{REF}$ having a voltage level lower than the pass voltage $V_{PASS}$ may be applied thereto.

The first drain selection line DSL1 and the first source selection line SSL1 may be activated so that the drain selection transistor DST and the source selection transistor SST included in the selected first memory string MS1 are turned on. The second drain selection line DSL2 and the second source selection line SSL2 may be deactivated so that the drain selection transistor DST and the source selection transistor SST included in the unselected second memory string MS2 are turned off.

Subsequently, a read voltage $V_{READ}$ may be applied to the selected word line WL2 and the pass voltage $V_{PASS}$ may be applied to the unselected word lines WL1 and WL3 to WLn, at step S120. The read voltage $V_{READ}$ may have a voltage level to determine data stored in a memory cell. For example, the voltage level of the read voltage $V_{READ}$ may be lower than a threshold voltage of a programmed memory cell and higher than a threshold voltage of an erased memory cell.

Thus, a channel may or may not be formed in the selected first memory string MS1 according to a program state of the selected memory cell MC2, that is, a threshold voltage thereof. Therefore, data of the selected memory cell MC2 may be read in response to a change in voltage or current of the bit line BL. In addition, the unselected second memory string MS2 may be separated from the bit line BL and the common source line CSL to be floated, and a channel voltage may be boosted.

Subsequently, the selected word line WL2 and the unselected word lines WL1 and WL3 to WLn may be equalized during an equalizing period, at step S130. As a result, the selected word line WL2 and the unselected word lines WL1 and WL3 to WLn may have substantially the same level.

In addition, during the equalizing period, a channel of the second memory string MS2 may be initialized by activating at least one selection line coupled to the unselected second memory string MS2. For example, the second source selection line SSL2 may be activated, or the second drain selection line DSL2 and the second source selection line SSL2 may be activated. Thus, the source selection transistor SST of the second memory string MS2 may be turned on, or the source selection transistor SST and the drain selection transistor DST thereof may be turned on. Therefore, the second memory string MS2 may be coupled to the common source line CSL, and the channel of the second memory string MS2 may be initialized to a ground voltage, that is, 0V.

When a read operation is performed, since the source selection transistor SST and the drain selection transistor DST included in the unselected second memory string MS2 remain turned-off, the unselected second memory string MS2 may maintain a floating level. That is, the channel of the second memory string MS2 may not be initialized, and the channel thereof may have a level lower or higher than 0V. Therefore, Hot Carrier Injection (HCI) disturbance may be caused due to the difference in electric field in the channel, so that the reliability of the semiconductor device may be deteriorated. Therefore, according to an embodiment, a period during which a selection line coupled to the unselected second memory string MS2 is temporarily activated may be included in the read operation. For example, during the equalizing period, the selection line coupled to the unselected second memory string MS2 may be temporarily activated. Therefore, disturbance or deterioration of the reliability of the semiconductor device may be prevented.

Figure 4:
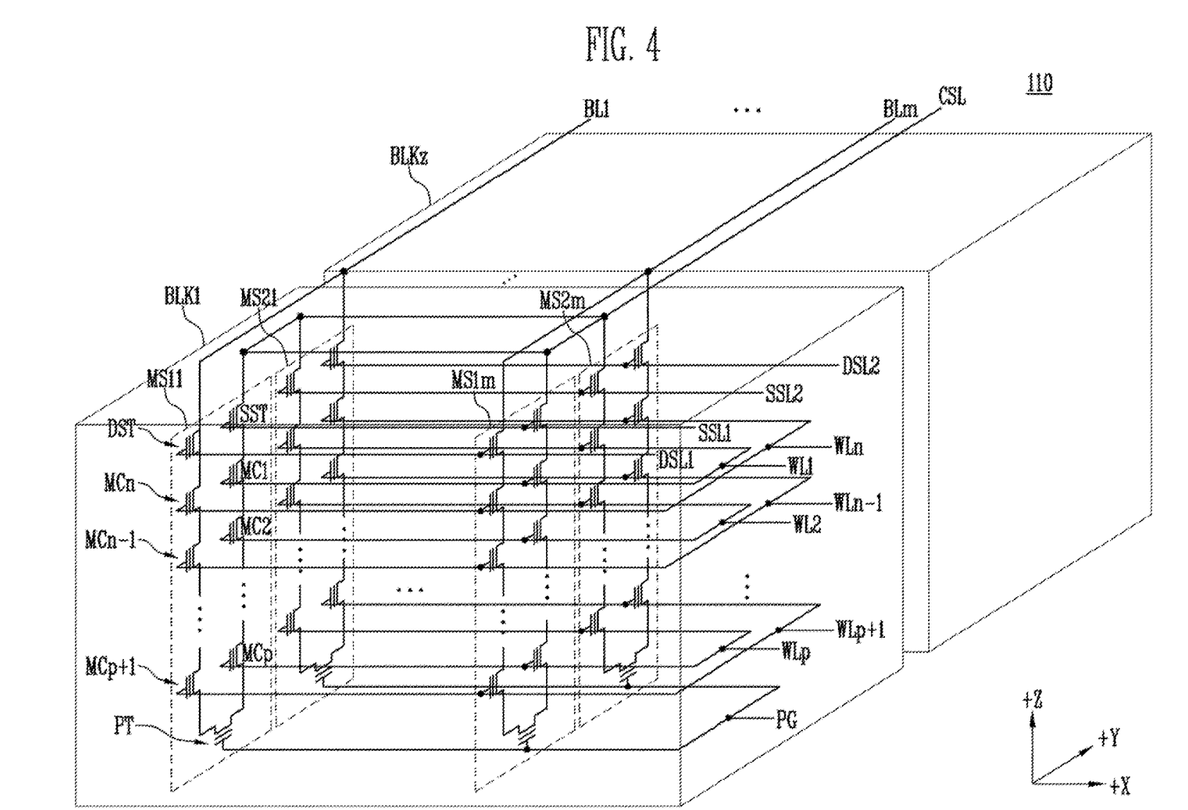
FIG. 4 is a circuit diagram illustrating a cell array structure of a semiconductor device according to an embodiment of the present invention.

FIG. 4 is a circuit diagram illustrating a cell array structure of a semiconductor device according to an embodiment of the present invention. The cell array 110 of FIG. 1 is illustrated in FIG. 4 as an example.

Referring to FIG. 4, the cell array 110 may include a plurality of memory blocks BLK1 to BLKz. The internal configuration of the first memory block BLK1 is mainly described below. A detailed description of the remaining memory blocks BLK2 to BLKz is omitted since these memory blocks have similar internal configurations and functions to the first memory block BLK1.

The first memory block BLK1 may include a plurality of memory strings MS11 to MS1$m$ and a plurality of memory strings MS21 to MS2$m$. For example, the first memory block BLK1 may include 'm' memory strings arranged in a row direction for example, +X direction and two memory strings arranged in a column direction for example, +Y direction. Three or more memory strings may also be arranged in the column direction. In addition, each of the memory strings MS11 to MS1$m$ and MS21 to MS2$m$ may be arranged in the shape of U.

Each of the memory strings MS11 to MS1$m$ and MS21 to MS2$m$ may include at least one source selection transistor SST, first to nth memory cells MC1 to MCn, a pipe transistor PT and at least one drain selection transistor DST.

The first to nth memory cells MC1 to MCn may be stacked in +Z direction. The first to pth memory cells MC1 to MCp may be coupled in series between the source selection transistor SST and the pipe transistor PT, and the (p+1)th to nth memory cells MCp+1 to MCn may be coupled in series between the pipe transistor PT and the drain selection transistor DST. In addition, gates of the first to nth memory cells MC1 to MCn of each of the memory strings MS11 to MS1$m$ and MS21 to MS2$m$ may be respectively coupled to first to nth word lines WL1 to WLn. A gate of the pipe transistor PT of each of the memory strings MS11 to MS1$m$ and MS21 to MS2$m$ may be coupled to a pipe line PG.

The memory strings MS11 to MS1$m$ and MS21 to MS2$m$ included in one memory block BLK1 may be coupled in common to a common source line CSL. In addition, connections between the memory strings MS11 to MS1$m$ and MS21 to MS2m and the common source line CSL may be respectively controlled by source selection lines SSL1 and SSL2.

The source selection transistors SST of the memory strings MS11 to MS1m and MS21 to MS2m arranged in the same row may be controlled by the source selection lines SSL1 and SSL2 extending in the same row direction. For example, the source selection transistors SST of the first memory strings MS11 to MS1m in the first row may be controlled by the first source selection line SSL1, and the source selection transistors SST of the second memory strings MS21 to MS2m in the second row may be controlled by the second source selection line SSL2.

The memory strings MS11 to MS1m and MS21 to MS2m included in one memory block BLK1 may be coupled to a plurality of bit lines BL1 to BLm. In addition, the respective connections between the plurality of memory strings MS11 to MS1m and MS21 to MS2m and the bit lines BL1 to BLm may be controlled by drain selection lines DSL1 and DSL2.

The drain selection transistors DST of the memory strings MS11 to MS1m and MS21 to MS2m arranged in the same row may be controlled by the drain selection lines DSL1 and DSL2 extending in the same row direction. For example, the drain selection transistors DST of the first memory strings MS11 to MS1m in the first row may be controlled by the first drain selection line DSL1, and the drain selection transistors DST of the second memory strings MS21 to MS2m in the second row may be controlled by the second drain selection line DSL2.

In addition, the memory strings MS11 to MS1m and MS21 to MS2m arranged in the same column direction may be coupled to the bit lines BL1 to BLm extending in the column direction. For example, the memory strings MS11 and MS21 in the first column may be coupled in common to the first bit line BL1, and memory strings MS1m and MS2m in an mth column may be commonly coupled to an mth bit line BLm in the mth column. Therefore, when the memory strings MS11 and MS21 are commonly coupled to one bit line BL1, the respective connections between the memory strings MS11 and MS21 and the bit line BL1 may be controlled by the first and second drain selection lines DSL1 and DSL2, respectively.

Figure 5:
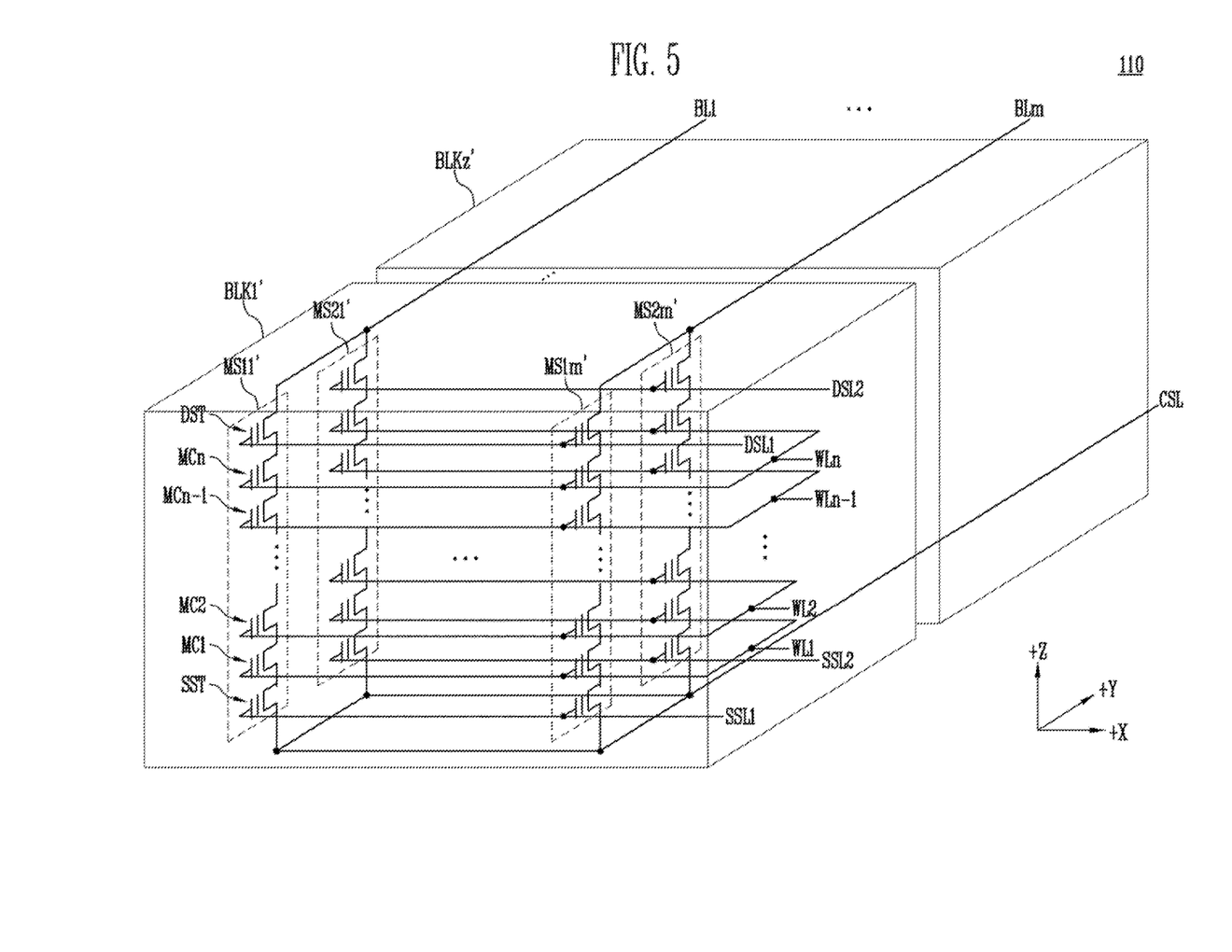
FIG. 5 is a circuit diagram illustrating a cell array structure of a semiconductor device according to an embodiment of the present invention.

FIG. 5 is a circuit diagram illustrating a cell array structure of a semiconductor device according to an embodiment of the present invention. The cell array 110 of FIG. 1 is illustrated in FIG. 5 as an example.

Referring to FIG. 5, the cell array 110 may include a plurality of memory blocks BLK1' to BLKz'. The internal configuration of the first memory block BLK1' is mainly described below. A detailed description of the remaining memory blocks BLK2' to BLKz' will be omitted since these memory blocks have similar internal configurations and functions as the first memory block BLK1'.

The first memory block BLK1' may include a plurality of memory strings MS11' to MS1m' and a plurality of memory strings MS21' to MS2m'. For example, the first memory block BLK1' may include 'm' memory strings arranged in a row direction for example, +X direction and two memory strings arranged in a column direction for example, +Y direction. In addition, each of the memory strings MS11' to MS1m' and MS21' to MS2m' may extend in +Z direction.

Each of the memory strings MS11' to MS1m' and MS21' to MS2m' may include at least one source selection transistor SST, first to nth memory cells MC1 to MCn and at least one drain selection transistor DST.

The plurality of memory strings MS11' to MS1m' and MS21' to MS2m' may be coupled between a plurality of bit lines BL1 to BLm and a common source line CSL. The source selection transistors SST of the first memory strings MS11' to MS1m' arranged in a first row may be coupled to a first source selection line SSL1. The source selection transistors SST of each of the second memory strings MS21' to MS2m' arranged in a second row may be coupled to a second source selection line SSL2. The drain selection transistors DST of the first memory strings MS11' to MS1m' in the first row may be coupled to a first drain selection line DSL1. The drain selection transistors DST of the second memory strings MS21' to MS2m' in the second row may be coupled to a second drain selection line DSL2. In addition, gate electrodes of the first to nth memory cells MC1 to MCn may be coupled to first to nth word lines WL1 to WLn, respectively.

As a result, the first memory block BLK1' shown in FIG. 5 may have a similar equivalent circuit to the memory block BLK1 shown in FIG. 4 except that the memory strings MS11' to MS1m' and MS21' to MS2m' do not include a pipe transistor.

Figure 6:
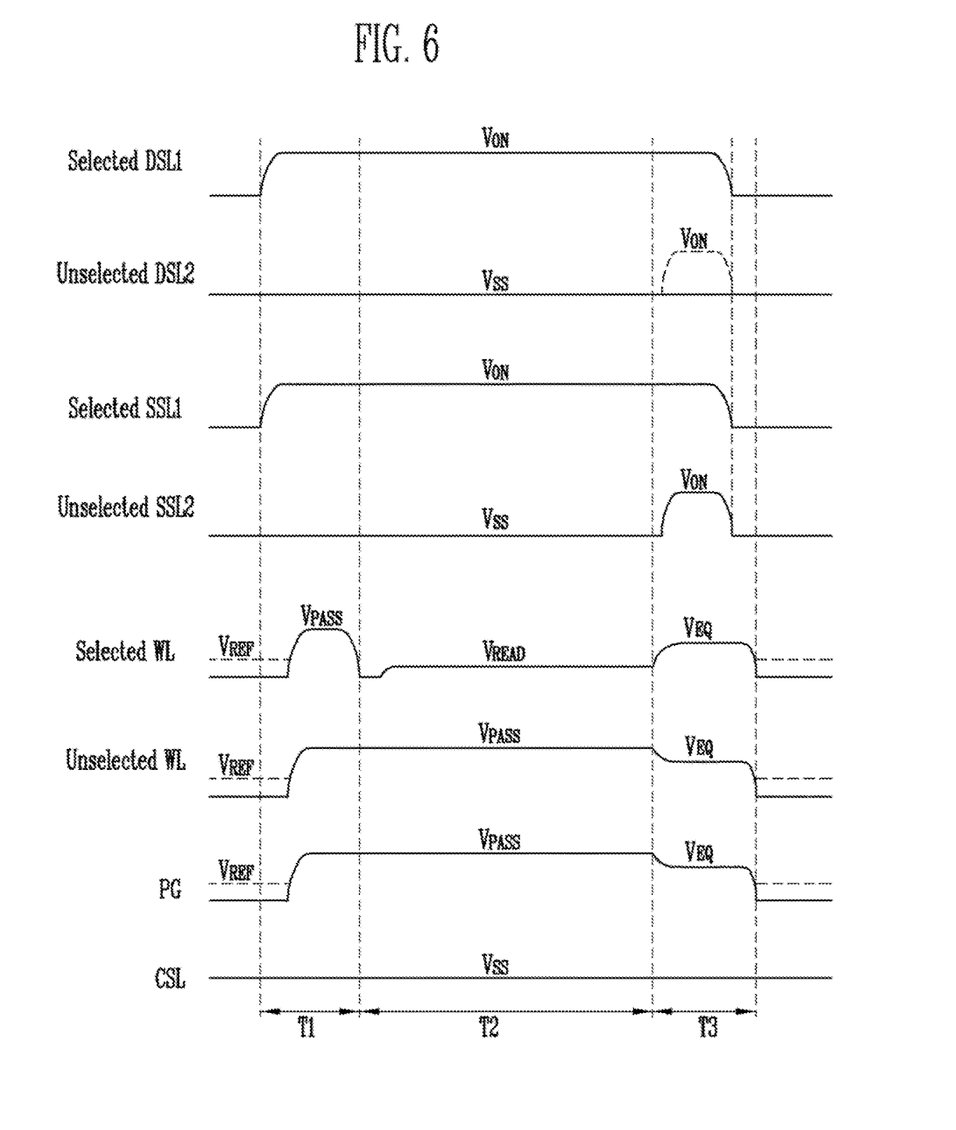
FIG. 6 is a timing diagram illustrating a method for operating a semiconductor memory device according to an embodiment of the present invention.

FIG. 6 is a timing diagram illustrating a method for operating a semiconductor device according to an embodiment of the present invention. A read operation of the semiconductor device having the cell array structure as shown in FIGS. 4 and 5 is described with reference to FIG. 6. Hereinafter, as an example a read operation is described below in which the memory strings MS11 to MS1m and the second word line WL2 of the first memory block BLK1 shown in FIG. 4 are selected.

Referring to FIG. 4, the selected memory block BLK1 may include the selected first memory strings MS11 to MS1m and the unselected second memory strings MS21 to MS2m. Therefore, the first drain selection line DSL1 and the first source selection line SSL1 coupled to the selected first memory strings MS11 to MS1m may be driven in a different manner from the second drain selection line DSL2 and the second source selection line SSL2 coupled to the unselected second memory strings MS21 to MS2m.

Referring to a first period T1 as shown in FIG. 6, a turn-on voltage $V_{ON}$ may be applied to the selected first drain selection line DSL1 and the selected first source selection line SSL1. The turn-on voltage $V_{ON}$ may have a voltage level to turn on the drain selection transistor DST and the source selection transistor SST. For example, the turn-on voltage $V_{ON}$ and the pass voltage $V_{PASS}$ may have substantially the same level. As a result, the drain selection transistors DST and the source selection transistors SST included in the selected first memory strings MS11 to MS1m may be turned on. In addition, a ground voltage $V_{SS}$ may be applied to the unselected second drain selection line DSL2 and the unselected second source selection line SSL2. As a result, the drain selection transistors DST and the source selection transistors SST included in the unselected second memory strings MS21 to MS2m may be turned off.

The pass voltage $V_{PASS}$ may be applied to the word lines WL1 to WLn. The pass voltage $V_{PASS}$ may be applied to the word lines WL1 to WLn regardless of whether or not these word lines are selected. In addition, the ground voltage $V_{SS}$ may be applied to the common source line CSL.

According to an embodiment, the selected first drain selection line DSL1, the selected first source selection line SSL1 and the word lines WL1 to WLn may be set at the same time or at an interval of time therebetween. For example, after the selected first drain selection line DSL1 and the selected first source selection line SSL1 are activated to turn on the drain selection transistors DST and the source selection transistors SST included in the selected first memory strings MS11 to MS1m, the pass voltage $V_{PASS}$ may be applied to the word lines WL1 to WLn.

According to another embodiment, the reference voltage $V_{REF}$ may be applied before the pass voltage $V_{PASS}$ is applied to the word lines WL1 to WLn. The reference voltage $V_{REF}$ may have a voltage level greater than 0V and lower than the pass voltage $V_{PASS}$. According to this embodiment, distribution deterioration of the memory cells MC1 to MCn included in the unselected memory strings MS21 to MS2m may be prevented.

According to the above-described cell array structure, the selected first memory strings MS11 to MS1m and the unselected second memory strings MS21 to MS2m may share the word lines WL1 to WLn. Therefore, a channel of the unselected second memory strings MS21 to MS2m may be boosted when the pass voltage $V_{PASS}$ is applied. In addition, as a result, a Gate Induced Drain Leakage (GIDL) phenomenon may occur in the unselected second memory strings MS21 to MS2m, and a cell distribution of the memory cells adjacent to the source selection transistor SST or the drain selection transistor DST may be deteriorated. Therefore, according to an embodiment, by applying the reference voltage $V_{REF}$ before applying the pass voltage $V_{PASS}$, a level by which the channel of the unselected second memory strings MS21 to MS2m is floated may be reduced by the reference voltage $V_{REF}$, so that a cell distribution deterioration may be prevented.

In the cell array shown in FIG. 4, the pass voltage $V_{PASS}$ may be applied to the pipe line PG. The pass voltage $V_{PASS}$ may have a voltage level to turn on the pipe transistor PT. In addition, the reference voltage $V_{REF}$ may be applied to the pipe line PG before the pass voltage $V_{PASS}$ is applied.

During a second period T2, the read voltage $V_{READ}$ may be applied to the selected word line WL2 and the pass voltage $V_{PASS}$ may be applied to the unselected word lines WL1 and WL3 to WLn. During the second period T2, the selected first drain selection line DSL1 and the selected first source selection line SSL1 may be activated, the unselected second drain selection line DSL2 and the unselected second source selection line SSL2 may be deactivated, and the common source line CSL may maintain a ground state.

Under these conditions, since a channel may or may not be formed in selected memory strings according to a threshold voltage of a selected memory cell, data of the selected memory cell may be read. For example, when the selected memory cell MC2 of the selected memory string MS11 is in an erase state, the selected memory cell MC2 may be turned on by the read voltage $V_{READ}$, and a channel may be formed in the selected memory string MS11. Therefore, current may flow from the bit line BL1 corresponding to the selected memory string MS11 to the common source line CSL, and a voltage of the corresponding bit line BL1 may be reduced. In addition, when the selected memory cell MC2 of the selected memory string MS1m is in a program state, the selected memory cell MC2 may be turned off by the read voltage $V_{READ}$, and a channel may not be formed in the selected memory string MS1m. Therefore, current may not flow from the bit line BLm corresponding to the selected memory string MS1m to the common source line CSL, so that a voltage of the bit line BLm may be maintained.

Under these conditions, since the unselected second memory strings MS21 to MS2m may be separated from the bit lines BL1 to BLm and the common source line CSL, the unselected second memory strings MS21 to MS2m may be floated. In addition, since the unselected second memory strings MS21 to MS2m and the selected first memory strings MS11 to MS1m share the word lines WL1 to WLn, a channel voltage of the unselected second memory strings MS21 to MS2m may be boosted.

During a third period T3, an equalizing voltage $V_{EQ}$ may be applied to the word lines WL1 to WLn so that the selected word line WL2 and the unselected word lines WL1 and WL3 to WLn may have substantially the same voltage level. The equalizing voltage $V_{EQ}$ may have a voltage level greater than the read voltage $V_{READ}$ and lower than the pass voltage $V_{PASS}$. Therefore, the selected word line WL2 may be increased by a predetermined level from the read voltage $V_{READ}$ and the unselected word lines WL1 and WL3 to WLn may be decreased by a predetermined level from the pass voltage $V_{PASS}$, so that the word lines WL1 to WLn may be equalized.

In addition, the unselected second source selection line SSL2 may be activated, or the unselected second drain selection line DSL2 and the unselected second source selection line SSL2 may be activated. The source selection transistors SST of the unselected memory strings MS21 to MS2m may be turned on, or the drain selection transistors DST and the source selection transistors SST thereof may be turned on. Therefore, the channel of the unselected second memory strings MS21 to MS2m may be initialized. For example, the channel of the unselected second memory strings MS21 to MS2m may be initialized to 0V.

According to an embodiment, the unselected second source selection line SSL2 and/or the unselected second drain selection line DSL2 may be activated after a given time from a start point of the third period T3. In addition, both the unselected second source selection line SSL2 and the unselected second drain selection line DSL2 may be activated at the same time point.

According to an embodiment, during the third period T3, the ground voltage $V_{SS}$ may be applied to the selected first drain selection line DSL1, the selected first source selection line SSL1, the unselected second drain selection line DSL2 and the unselected second source selection line SSL2. A time point when the voltage applied to the unselected second source selection line SSL2 and/or the unselected second drain selection line DSL2 changes from the turn-on voltage $V_{ON}$ to the ground voltage $V_{SS}$ during the third period T3 may be the same as a time point when the voltage applied to the selected first source selection line SSL1 and the selected first drain selection line DSL1 changes from the turn-on voltage $V_{ON}$ to the ground voltage $V_{SS}$. This time point may precede an end point of the third period T3.

According to the above-described driving method, since a period during which at least one selection line coupled to the unselected second memory strings MS21 to MS2m is temporarily activated is included in a read operation, the channel of the unselected second memory strings MS21 to MS2m may be initialized. Therefore, reliability of the semiconductor device may be improved.

In addition, since the reference voltage $V_{REF}$ is applied to the unselected word line WL1 and WL3 to WLn and the pipe line PG before the pass voltage $V_{PASS}$ is applied thereto, floating levels of the unselected second memory strings MS21 to MS2m may be reduced and a cell distribution deterioration may be reduced.

Figure 7:
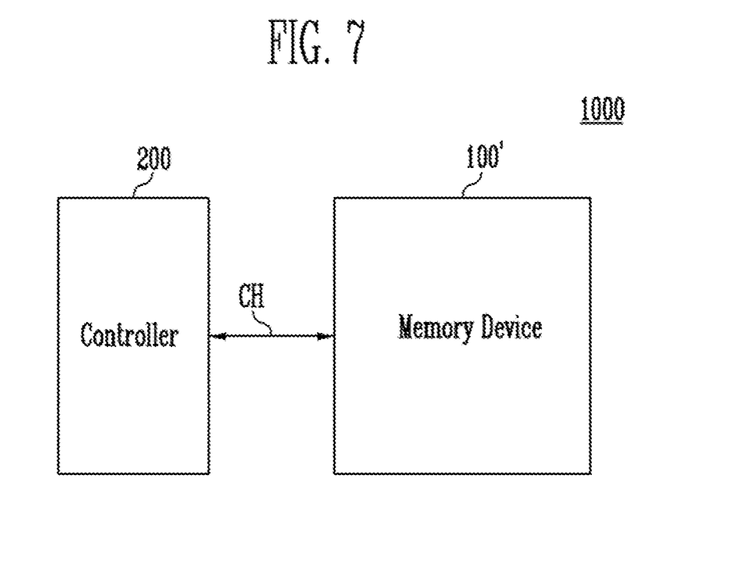
FIGS. 7 and 8 are block diagrams illustrating a memory system according to an embodiment of the present invention.

FIG. 7 is a block diagram illustrating a memory system 1000 according to an embodiment of the present invention.

Referring to FIG. 7, the memory system 1000 may include a memory device 100' and a controller 200.

The controller 200 may control the memory device 100' through a channel CH and the memory device 100' may operate in response to control of the controller 200. The memory device 100' may include a memory cell array including a plurality of memory blocks. According to an embodiment, the memory device 100' may be the above-described semiconductor device 100. The memory device 100' may include a flash memory device.

The controller 200 may control the memory device 100' to perform a predetermined operation in response to a request from a host (not shown). In addition, the memory device 100' may receive a command and an address from the controller 200 through the channel CH and access an area selected from the memory cell array in response to the address. That is, the memory device 100' may perform an internal operation corresponding to the command on the area selected by the address.

The controller 200 may control the memory device 100' to perform a program operation, a read operation, or an erase operation. During the program operation, the controller 200 may provide a program command, an address, and data to the memory device 100' through the channel CH, and the memory device 100' may program the data to the area selected by the address in response to the program command. During the erase operation, the controller 200 may provide an erase command and an address to the memory device 100' through the channel CH, and the memory device 100' may erase data stored in the area selected by the address in response to the erase command.

During the read operation, the controller 200 may provide a read command and an address to the memory device 100' through the channel CH. The memory device 100' may output data read from an area selected by the address through the channel CH in response to the read command. This read operation may include a read operation serving as verification entailed by a program or erase operation as well as a read operation performed to read and output data stored in a memory cell.

When the read operation is performed, the memory device 100' may activate at least one selection line coupled to unselected memory strings. That is, the read operation may include a period during which at least one selection line is temporarily activated. For example, the read operation may include an equalizing period during which a selected word line and unselected word lines are equalized, and at least one selection line may be activated during the equalizing period.

According to this method, since the period during which at least one selection line coupled to the unselected memory strings is temporarily activated is included in the read operation, a channel of the unselected memory strings may be initialized. Therefore, reliability of the memory device 100' may be improved.

Figure 8:
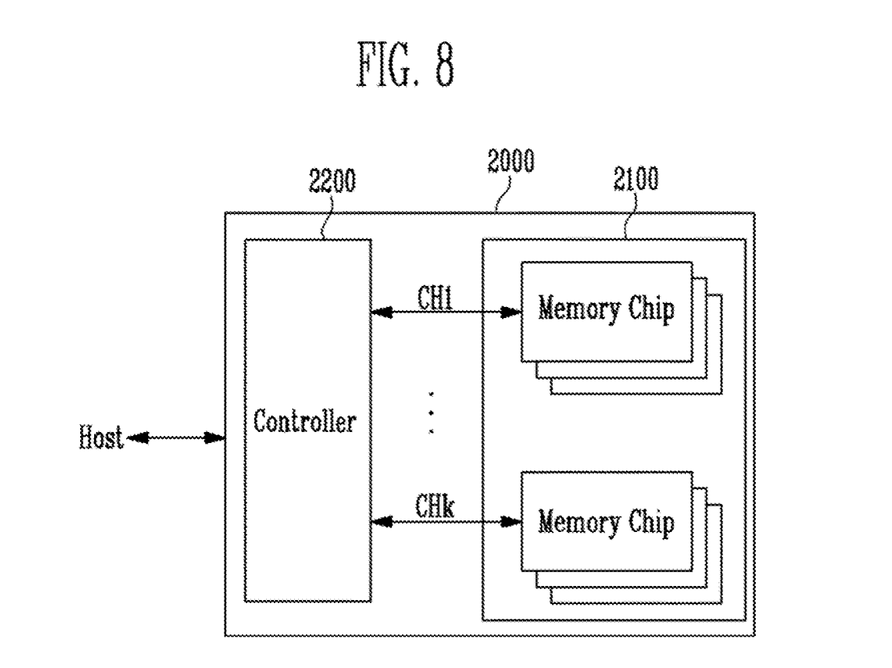

FIG. 8 is a block diagram illustrating a memory system 2000 according to an embodiment of the present invention.

Referring to FIG. 8, the memory system 2000 may include a memory device 2100 and a controller 2200.

The memory device 2100 may be a semiconductor device and include a plurality of memory chips. The semiconductor memory chips may be divided into a plurality of groups. The plurality of groups may communicate with the controller 2200 through first to kth channels CH1 to CHk. Each of the memory chips may be configured and operated in substantially the same manner as the semiconductor device 100 described above with reference to FIG. 1.

Each group may communicate with the controller 2200 through a single common channel among the first to kth channels CH1 to CHk. The controller 2200 may be configured in substantially the same manner as the controller 200 described with reference to FIG. 7, and configured to control the plurality of memory chips of the memory device 2100. The memory system 2000 may be modified so that a single memory chip may be coupled to a single channel.

The controller 2200 and the memory device 2100 may be integrated in one semiconductor device. According to an embodiment, the controller 2200 and the memory device 2100 may be integrated in a single semiconductor device to form a memory card such as a PC card in the form of a personal computer memory card international association (PCMCIA), a compact flash (CF) card, a smart media card (SMC), a memory stick, a multimedia card in the form of MMC, RS-MMC and micro-MMC, a secure digital card in the form of SD, mini-SD, micro-SD and secure digital high capacity (SDHC), a universal flash storage device (UFS), etc.

The controller 2200 and the memory device 2100 may be integrated in a single semiconductor device to form a solid state drive (SSD). The SSD may include a storage device for storing data in a memory. When the memory system 2000 is used as an SSD, operational rates of the host coupled to the memory system 2000 may be significantly improved.

In another example, the memory system 2000 may be used as one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, etc.

Figure 9:
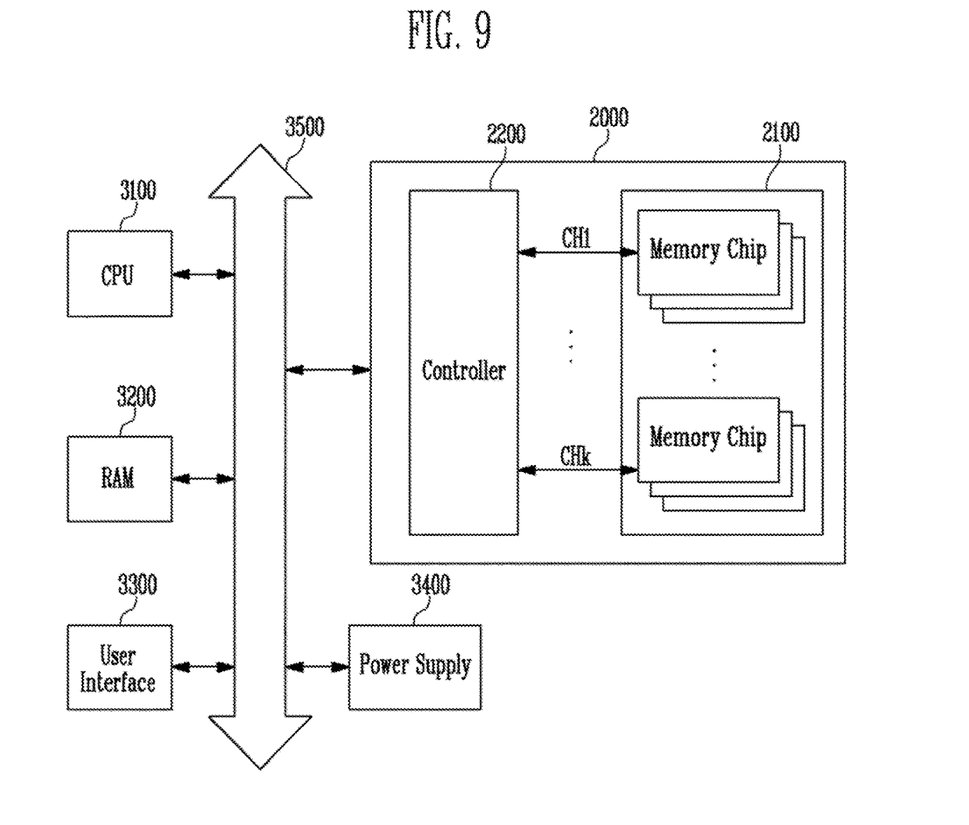
FIG. 9 is a block diagram illustrating a computing system according to an embodiment of the present invention.

FIG. 9 is a block diagram illustrating a computing system 3000 according to an embodiment of the present invention. As an example, the computing system 3000 includes the memory system 2000 illustrated in FIG. 8.

Referring to FIG. 9, the computing system 3000 may include a central processing unit 3100, a random access memory (RAM) 3200, a user interface 3300, a power supply 3400, a system bus 3500, and the memory system 2000.

The memory system 2000 may be electrically connected to the central processing unit 3100, the RAM 3200, the user interface 3300 and the power supply 3400 through the system bus 3500. Data provided trough the user interface 3300 or processed by the central processing unit 3100 may be stored in the memory system 2000.

In FIG. 9, the memory device 2100 may be coupled to the system bus 3500 through the controller 2200, or directly coupled to the system bus 3500. When the memory device 2100 is directly coupled to the system bus 3500, functions of the controller 2200 may be performed by the central processing unit 3100 and the RAM 3200.

The computing system 3000 may include the memory system 2000 shown in FIG. 8 or the memory system 1000 shown in FIG. 7. In addition, the computing system 3000 may include both of the memory systems 1000 and 2000 described above with reference to FIGS. 7 and 8.

At least one selection line coupled to unselected memory strings may be temporarily activated during a read operation. For example, at least one selection line may be activated during an equalizing period. Therefore, a channel of unselected memory strings may be initialized, and reliability of a semiconductor device may be improved.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A method for operating a semiconductor device including a bit line, a plurality of memory strings connected in common to the bit line, a plurality of word lines coupled to the plurality of memory strings, a first selection line controlling a connection between one of the plurality of memory strings and the bit line, a common source line commonly coupled to the plurality of memory strings, and a second selection line controlling a connection between one of the plurality of memory strings and the common source line, the method comprising:

activating the first selection line coupled to a selected first memory string among the plurality of memory strings, and deactivating the second selection line coupled to an unselected second memory string among the plurality of memory strings;

applying a read voltage to a selected word line among the plurality of word lines, and a pass voltage to an unselected word line among the plurality of word lines; and applying an equalizing voltage to the selected word line and the unselected word line wherein the equalizing voltage has a voltage level greater than a voltage level of the read voltage and lower than a voltage level of the pass voltage, wherein the second selection line is activated during the equalizing of the selected and unselected word lines.

2. The method of claim 1, wherein the second selection line includes a source selection line, or the second selection line includes source and drain selection lines.

3. The method of claim 1, wherein, during the equalizing of the selected and unselected word lines, the second selection line is temporarily activated to initialize a channel of the unselected second memory string.

4. The method of claim 3, wherein the channel of the unselected second memory string is initialized to a ground voltage.

5. The method of claim 1, further comprising:
applying a reference voltage lower than the pass voltage to the unselected word line before applying the pass voltage.

6. The method of claim 1, further comprising:
applying the pass voltage to the selected word line before applying the read voltage.

7. The method of claim 6, further comprising:
applying a reference voltage lower than the pass voltage to the selected word line before applying the pass voltage to the selected word line.

8. A semiconductor device, comprising:
a bit line;
a plurality of memory strings connected in common to the bit line;
a plurality of first selection lines controlling connections between the plurality of memory strings and the bit line, respectively;
a plurality of word lines coupled to the plurality of memory strings;
a common source line commonly coupled to the plurality of memory strings;

a plurality of second selection lines controlling connections between the plurality of memory strings and the common source line, respectively; and a control logic temporarily activating at least one selection line coupled to unselected memory strings, among the first and second selection lines, during a read operation, wherein the read operation includes an equalizing period for equalizing voltages of a selected word line and unselected word lines to a voltage level greater than a voltage level of a read voltage and lower than a voltage level of a pass voltage, and the at least one selection line is activated during the equalizing period.

9. The semiconductor device of claim 8,
wherein the control logic applies the read voltage to the selected word line and the pass voltage to the unselected word lines.

10. The semiconductor device of claim 9, wherein the control logic applies a reference voltage lower than the pass voltage to the unselected word lines before applying the pass voltage.

11. The semiconductor device of claim 9, wherein the control logic applies the pass voltage to the selected word line before applying the read voltage.

12. The semiconductor device of claim 11, wherein the control logic applies a reference voltage lower than the pass voltage to the selected word line before applying the pass voltage to the selected word line.

13. The semiconductor device of claim 9, wherein each of the memory strings comprises:
at least one first selection transistor coupled to the bit line, and having a gate controlled by the first selection line;
at least one second selection transistor coupled to the common source line, and having a gate controlled by the second selection line; and
a plurality of memory cells coupled in series between the first selection transistor and the second selection transistor, each memory cell having a gate controlled by a corresponding one of the word lines.

14. The semiconductor device of claim 8, wherein the control logic temporarily activates the second selection lines coupled to the unselected memory strings, or temporarily activates the first and second selection lines coupled to the unselected memory strings, during the read operation.

15. A memory system, comprising:
a controller; and
a memory device including a bit line, a plurality of memory strings connected in common to the bit line, a plurality of first selection lines controlling connections between the plurality of memory strings and the bit line, respectively, a plurality of word lines coupled to the plurality of memory strings, and a common source line commonly coupled to the plurality of memory strings, and a plurality of second selection lines controlling connections between the plurality of memory strings and the common source line, respectively,
wherein the controller controls the memory device to perform a read operation,
wherein the read operation includes an equalizing period during which an equalizing voltage is applied to a selected word line and unselected word lines, the equalizing voltage having a voltage level greater than a voltage level of a read voltage and lower than a voltage level of a pass voltage, and at least one selection line coupled to unselected memory strings is temporarily activated during the equalizing period.

16. The memory system of claim 15, wherein the read operation includes a period during which the read voltage is applied to the selected word line and the pass voltage is applied to the unselected word lines.

17. The memory system of claim 16, wherein a reference voltage lower than the pass voltage is applied to the unselected word lines before the pass voltage is applied.

* * * * *